United States Patent [19]

Blecha, Jr.

[11] Patent Number: 5,166,937
[45] Date of Patent: Nov. 24, 1992

[54] ARRANGEMENT FOR TESTING DIGITAL CIRCUIT DEVICES HAVING TRI-STATE OUTPUTS

[75] Inventor: John F. Blecha, Jr., Elk Grove Village, Ill.

[73] Assignee: AG Communication System Corporation

[21] Appl. No.: 633,847

[22] Filed: Dec. 26, 1990

[51] Int. Cl.[5] .......................................... G01R 31/28
[52] U.S. Cl. ................................. 371/22.5; 371/22.1
[58] Field of Search ............... 371/22.1, 225; 364/266, 364/943.9; 324/73 AT

[56] References Cited

U.S. PATENT DOCUMENTS 4,583,223  4/1986  Inoue et al. ................... 371/22.1

Primary Examiner—Vincent P. Canney

[57] ABSTRACT

An arrangement is disclosed that is added to digital circuit device for providing a way of easily verifying that the device's input and output circuits are operating and connected properly. The arrangement implements a test mode in which a simple exercising sequence is placed on any single input of a defined sequential group of device pins. A resultant output can be observed on the next occurring output and all subsequent outputs of the defined sequential group.

1 Claim, 3 Drawing Sheets

ARRANGEMENT FOR TESTING DIGITAL CIRCUIT DEVICES HAVING TRI-STATE OUTPUTS

CROSS-REFERENCE TO RELATED APPLICATIONS

Cross-reference is made to related U.S. patent applications titled: "An Arrangement For Testing Digital Circuit Devices Having Bidirectional Outputs," U.S. application Ser. No. 7,633,853; and "An Arrangement For Testing Digital Circuit Devices," U.S. application Ser. No. 7/633,861, all filed on the same date and by the same assignee as the present Application.

BACKGROUND OF THE INVENTION

1. Field of the Invention

The present invention relates in general to the field of digital electronics, and more particularly to an arrangement for implementing the testing and verification of digital circuits after manufacture.

2. Description of the Prior Art

Typically, in the manufacture of digital electronic systems, circuit assemblies are first given an "In-Circuit" test after they have been assembled. This test attempts to individually verify each component in a circuit assembly, and its connections. The intent of this test is to verify that there are no manufacturing defects present. Other functional tests follow the In-Circuit test to verify the assembly's total operation.

When a digital circuit device is In-Circuit tested, its inputs are driven with a specific set of patterns or vectors and its outputs observed that they comply with an expected pattern. For SSI (Small Scale Integration) and some MSI (Medium Scale Integration) circuit devices this testing method does not present a problem. However, for hybrids, larger MSI, LSI (Large Scale Integration) circuit devices, ASICs (Application Specific Integrated Circuits) and USICs (User Specific Integrated Circuits) such as electronically programmable logic devices, testing in this manner is difficult. The number of test patterns or vectors required to completely test these complex devices is inherently very large. The number of patterns required to simply exercise each input and output of the circuit device, is extremely large and cumbersome and usually has to be manually generated.

In order to completely exercise a device, a complete logic state sequence must be provided to the circuit device under test. It is very difficult to reliably apply these large test patterns. This is due to the necessity to force other digital devices, that are co-located on the substrate and that drive the device under test, to logic states that are opposite to their current state. The above process is called "backdriving" or "overdriving", and can only be done for a limited time without harming the backdriven device. Therefore, the long testing sequences required for large and complex circuit devices can not be used without harming the circuit device under test.

One method employed in addressing the above mentioned problem is to use special testing sequences which use fewer vectors. As a result, the test typically does not fully exercise the device inputs and outputs and therefore, can not catch all the faults that may be present.

Another method of testing large digital circuit devices is the implementation of special circuitry in the device to provide a test mode. The test mode allows the device to be verified in some manner with a limited number of patterns. An example of this approach is the addition of multiplexers in series with the inputs and demultiplexers in series with the device outputs. The multiplexers are connected in such a way as to allow bypassing of the original internal device circuitry when in a test mode. In this manner an output of a device can be directly controlled by a selected corresponding input. This system works well as long as the number of input pins of a device are equal to the number of output pins. If the number of inputs and outputs are not equal, then additional circuitry is required to share pins. As a result, this method adds a significant amount of complexity and overhead to a digital circuit device.

One other example of added test circuitry, is the proposal by JTAG (Joint Test Action Group). The proposal, which is primarily intended for integrated circuits, involves implementing a scan shift register circuit for each input and output of a digital circuit device. Thereby, through a SCAN-IN test pin, a test pattern of 1s and 0s may be shifted into the shift register. The pattern subsequently appears on the device output pins. Further, the logic levels present on a circuit device's input pins can be latched and shifted out of a SCAN-OUT test pin. In this manner, a simpler set of test vectors can exercise each circuit device pin and check its connection to the surrounding circuit. The circuitry that is added in all test systems such as the above described JTAG proposal is independent of the sequence of input and output pins of a circuit device. Also, the JTAG proposal requires several device pins to support its functions as well as requiring a significant amount of circuit device "area" for inclusion of the test circuitry.

Accordingly, it is an object of the present invention to provide a test support circuit, which is added to a digital circuit device, that provides a method for easily verifying that the circuit device input and output circuits are correctly connected and operating properly.

SUMMARY OF THE INVENTION

The above and other objects, advantages, and capabilities are realized in an arrangement for testing the inputs and outputs of a digital circuit device. The arrangement is connected to digital circuit device according to sequential groups of inputs and outputs. A test mode control input is also included for activating the testing arrangement of the present invention.

The arrangement comprises a first test signal input circuit connected to the first input of a sequential group. The first test signal input circuit is arranged to receive a test signal applied to the first input and to pass the test signal to the first sequential group input and to an included test out lead. A second, test signal input circuit includes an EXCLUSIVE NOR gate having a first input lead connected to a test out lead and a second input lead connected to the next input in the sequential group. The gate is arranged to exclusively combine the signals received on the second input with the signals received on the first input during testing and generate and output on an included test out lead a new test out signal.

The arrangement further includes a first test signal output circuit having a first input connected to an output of the sequential group that is not the last output of the group. A second input is connected to a test out signal from an adjacent test out lead. The second input lead includes an inverting gate which inverts the input test out signal. The first test signal output circuit further includes an enable test control lead for selecting between the first and second inputs. A standard output lead passes the signal selected. A test out lead connected to the output of the inverting gate passes the inverted test signal to the next test circuit in the sequential group. A second test signal output circuit includes a first input connected to an output of the sequential group that is the last output of the group. A second input is connected to a test out signal from an adjacent test out lead. The second input lead also includes an inverting gate that inverts the input test out signal. An enable test control lead selects between the first and the second inputs. A standard output lead passes the signal selected for input to the final sequential output of the digital circuit device under test, thereby, passing the signal input into the first test signal input circuit from the second test signal output circuit standard output.

Tri-state outputs included in the sequential group of the digital circuit device require special handling when being exercised. A first test signal tri-state output circuit is provided that is connected to a tri-state output of the sequential group that is not the last output of the group. The first test signal tri-state output circuit is similar to the first output circuit described above, except that it includes an OR gate that has a first input connected to the enable test control lead and a second input connected to a driver control input from the digital circuit device. The output of the OR gate enables a tri-state driver that is connected to the output lead of the first test signal tri-state output circuit. A second test signal tri-state output circuit is also included that connects to the tri-state output of the sequential group that is the last output of the group. The second test signal tri-state output circuit is similar to the first tri-state output circuit except that a test out lead is not included.

BRIEF DESCRIPTION OF THE DRAWINGS

A better understanding of the invention may be had from the consideration of the following detailed description taken in conjunction with the drawings included wherein.

DESCRIPTION OF A PREFERRED EMBODIMENT

Figure 3:
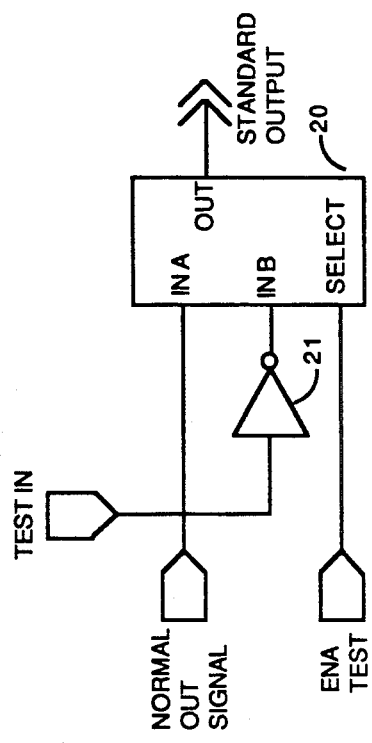
FIG. 3 is a schematic drawing of the circuit connected on the last output in a sequential group, in accordance with the present invention.

The arrangement of the present invention defines simple circuitry, which when added to a digital circuit device, provides an easily utilized and effective arrangement for testing the device. In order to implement the arrangement of the present invention, it is first necessary to identify a sequential group of inputs and outputs on the digital circuit device to which the test circuit is to be applied. All sequential groups must start at the first input after an output. A sequential group could encompass all the applicable digital circuit devices' digital input and output pins.

Any sequential group could also be terminated at any point where a non-bidirectional output precedes an input. In this instance, multiple sequential groups may be required to cover all of a device's applicable pins. The identification and grouping of input/output circuits, and the direction of movement between them, should always attempt to step between adjacent pins on the devices final package.

Any direction of movement for moving between the pins of a device can be selected Pins used to power the device are skipped. Pins which set up the test mode may be skipped if disturbing their state would affect maintaining the test mode being used. Further, any other non-digital pin can be skipped and ignored. In the simplest implementation a single pin can be used to enable this test mode. All that is required by the arrangement of the present invention, is the application of a single TEST MODE ENABLE signal. For purposes of this discussion it will be assumed that the TEST MODE ENABLE signal is generated in some manner and available to the arrangement of the present invention.

The physical test circuit of the present arrangement is determined by starting at the first input pin of a sequential group. The input pin is then driven by a test signal connected directly to the input pin. The resulting signal is called the TEST OUT signal and is propagated forward to the next pin in the sequential group. If the next pin is an input, then an EXCLUSIVE NOR is used to combine that input's logic level with the TEST OUT signal from the previous pin and derive a new TEST OUT signal. The new TEST OUT signal is also forwarded to the next pin. When the next pin is an output pin the TEST OUT signal is first inverted before it is input into the pin. A multiplexer element must be added to the output pin so that the TEST MODE ENABLE signal can deselect the normal output signal and select the TEST OUT signal. If two outputs are adjacent then the inverted TEST OUT signal of the first output becomes the new TEST OUT signal and is forwarded to the second output.

Tri-state and Bidirectional pins are always "turned on" in this testing arrangement and therefore considered as outputs. In these cases, circuit elements must be added to allow the TEST MODE ENABLE signal to turn on the output driver. However, in the case of bi-directional pins, an input section is included along with the tri-state output. In the arrangement of the present invention, the input section of a bidirectional pin is always used to derive a TEST OUT signal which is propagated forward to the next pin.

The forwarding, inverting and placing of the TEST OUT signal within a sequential group continues until the last pin of the sequential group where the test circuitry is connected. At this point the forwarding of the TEST OUT signal is terminated.

The arrangement then proceeds to the next sequential group of pins and continues until all pins have been addressed. Any sequential group can end at an output which precedes an input. However, any sequential group must end at the output which precedes the start of the current sequential group or any other sequential group. The digital circuit device design is then completed and fabricated with the added test circuit included in the design.

In operation the test circuitry of the present invention places a digital circuit device in a test mode, and an input of the digital circuit device is used to provide the logic states to the next occurring output pin. Therefore, the toggling of each input pin can be observed at the next higher occurring pin in a sequential group. The EXCLUSIVE NOR allows the propagation of the signal forward irregardless of the logic state of the next or previous input pin. Thus, if an input pin were "stuck high" or "stuck low" the tests of the other pins could proceed and not be blocked. Additionally, testing each input sequentially assures that no two adjacent input pins are shorted together. Forwarding the test signal to all adjacent outputs allows all outputs to be observed simultaneously for proper operation. Inverting adjacent outputs insures that adjacent output pins which are shorted together can also be detected.

IMPLEMENTATION

The test support circuitry described herein is intended to be applicable to any digital circuit device. These devices can have any one of a very large number of sequences of inputs and outputs. A device's I/O (input/output) pin sequence may in some cases be determined by the intended function of the device. All that is required to generate the following test circuitry is the identification of a device's input and output pin sequence, along with the types of outputs used. Beyond the I/O pin sequence however, the test support circuitry disclosed here is independent of the intended device's function.

The I/O pin sequence of a device circuit device can always be arranged into one or more sequential groups. The rules used to define a sequential group of pins are as follows:

1. The sequential group starts at an input pin which follows a non-bidirectional output pin.
2. A sequential group can be ended on any non-bidirectional output which precedes an input.
3. A sequential group must end at any output which precedes the starting input of a sequential group.
4. The pins of a device are treated as if they are in a loop. This means that the next pin after whatever is identified as the "last" or ending pin of a device pin sequence, is the first or starting pin of that device. Take for example a 16 pin device on which the pins are numbered sequentially. In this case pin 1 would follow pin 16.

There are no limits to the size of a sequential group. Obviously a sequential group can be no smaller than two pins, and it can be no larger than the number of pins on a device. Any direction of movement can be selected to move through the pins of a device. It is most beneficial, however, that the direction chosen would step through adjacent pins of a device's final package. This is because the testing arrangement of the present invention is particularly directed to detect adjacent pin shorts. As devices are being implemented in smaller packages, their pin to pin spacing is becoming extremely small. This significantly raises the probability of having adjacent pin shorts after the device has been assembled to its substrate.

Figure 4:
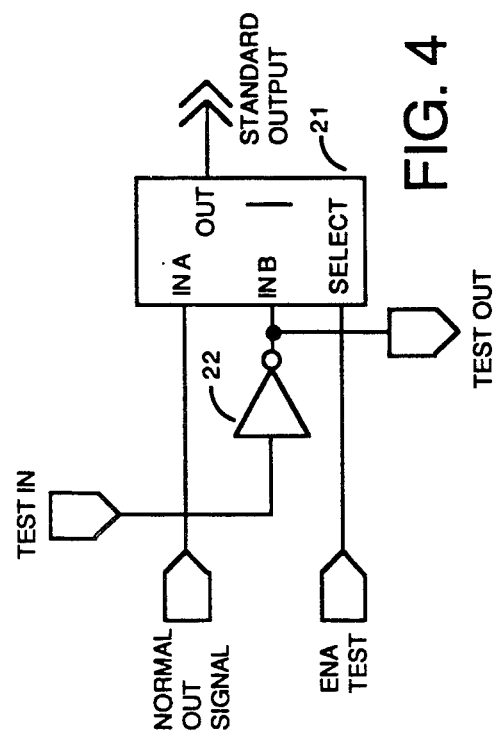
FIG. 4 is a schematic drawing of the circuit connected on the outputs in a sequential group, in accordance with the present invention.
Figure 1:
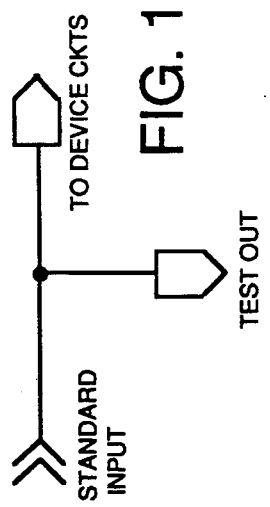
FIG. 1 is a schematic drawing of the test circuit used on the first input of a sequential group, in accordance with the present invention.
Figure 2:
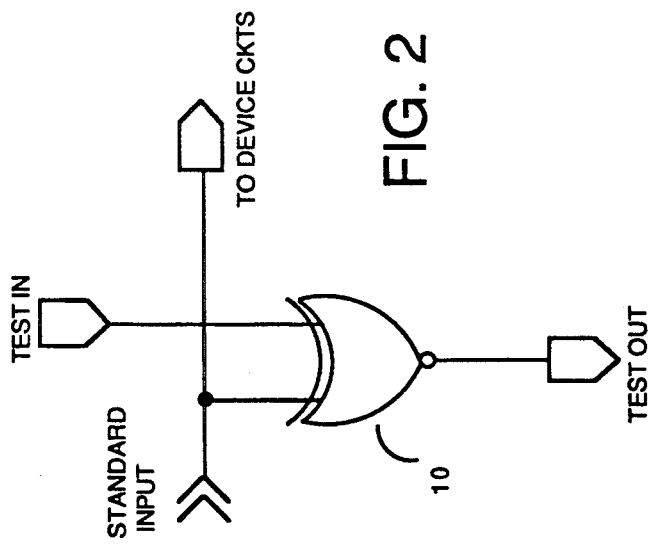
FIG. 2 is a schematic drawing of the test circuit used on the inputs of a sequential group, in accordance with the present invention.
Figure 4A:
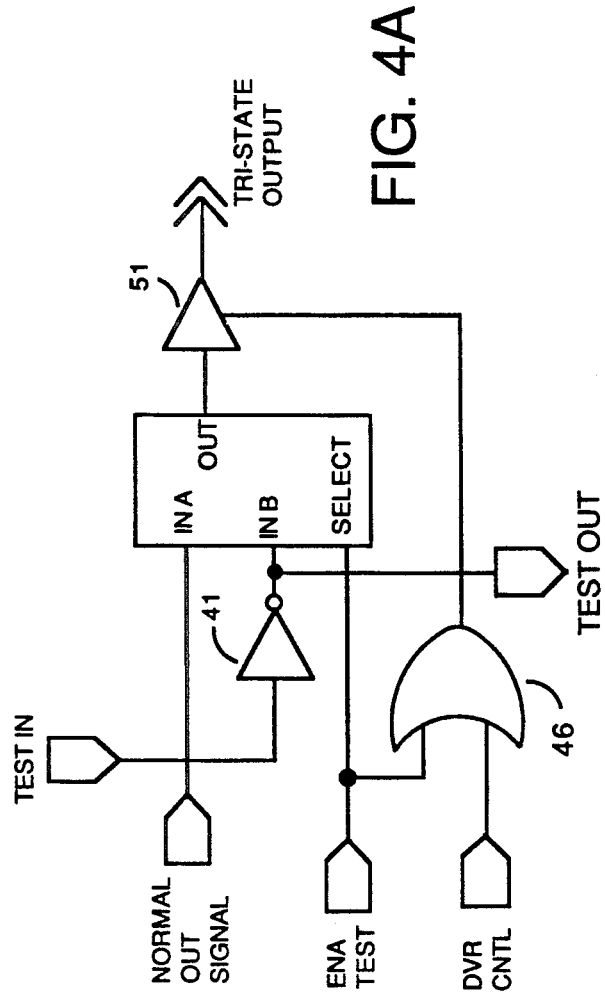
FIG. 4A is a schematic drawing of the circuit connected on the outputs in a sequential group when they are tri-state outputs, in accordance with the present invention.
Figure 3A:
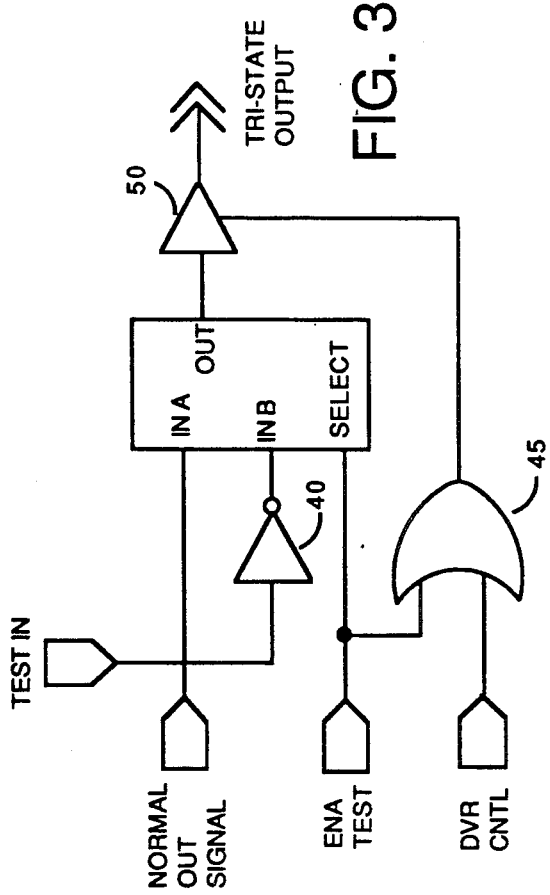
FIG. 3A is a schematic drawing of the circuit connected on the last output in a sequential group if it is a tri-state output, in accordance with the present invention.

The implementation then proceeds with the determination and addition of test logic circuit elements to each pin of a sequential group. To implement the required test circuitry the following rules are followed:

1. If the pin is the initial (input) pin of a defined sequential group, the circuit shown in FIG. 1 is connected to that pin.
2. If the pin is an input pin, other than the first pin in a sequential group the circuit shown in FIG. 2 is connected to that pin.
3. If the pin is a standard output, and it is the last pin in a sequential group, then the circuit shown in FIG. 3 is connected to the pin. If the pin has a tri-state output then the circuit shown in FIG. 3A is connected.
4. If the pin is a standard output, and it is not the last pin in a sequential group, then the circuit shown in FIG. 4 is connected to that pin. If the pin has a tri-state output then the circuit shown in FIG. 4A is connected.
5. If the output pin is bidirectional, connect a bidirectional circuit to the pin.
6. Skip any pins which power the device, and which would effect the maintenance of the device in the test mode.
7. For the second through the last test circuit added to a pin, connect the TEST IN net of the current pin test circuit to the TEST OUT net of the previous pin test circuit. The test signal nets should be connected over any pins that are skipped as though they were not present.

The process of adding the test support circuits to the digital circuit device pins continues until all pins of a sequential group have been implemented. After the sequential group has been completed, the next sequential group of pins is identified and implemented. This process continues until all pins have had their test circuits added or are skipped. The digital circuit device is finally manufactured with the added test support circuitry.

It is the selection of test support circuitry from a defined set of circuits, which impart the uniqueness, simplicity of implementation, and effectiveness to the resulting arrangement of the present invention.

DESCRIPTION OF TEST CIRCUITS

The circuit to be added to a device for the first pin of a sequential group, per rule 1, is shown in FIG. 1. This circuit simply shows the connection to the pin net to generate the first TEST OUT signal. The TEST OUT signal is always provided to the next pin in a defined sequential group.

The circuit to be added to every input pin of a sequential group, other than the first, per rule 2, is shown in FIG. 2. This circuit shows the inclusion of an EXCLUSIVE NOR 10 to the TEST IN signal with the connected pins input signal to generate a new TEST OUT signal. Again, with the naming conventions being used for these circuits, it must be understood that the TEST OUT net of a first occurring test circuit is to be connected to the TEST IN net of the next occurring test circuit within a pin sequence.

The circuit to be added to the last standard output in a sequential group, per rule 3, is shown in FIG. 3. This circuit shows the selection of either the inverted TEST IN signal or the selection of the normal output signal via a multiplexer logic element 20. The multiplexer element 20 is controlled by the ENABLE TEST signal (ENA TEST). The ENABLE TEST signal is generated by test support circuitry (not shown) on the digital circuit device and is true only when this test mode is enabled on the device. Thus, when ENABLE TEST is true the TEST IN signal is inverted by inverting gate 21 and will be output from the device pin.

The circuit to be added to every other standard output pin in a sequential group, per rule 4, is shown in FIG. 4. This circuit is based on an exact copy of the circuit shown in FIG. 3, and operates in a similar manner. However, a TEST OUT signal has been added by connecting to the output of the inverter 22 being driven by the TEST IN signal. The new TEST OUT signal is next pin in sequence as explained above.

When the outputs include tri-state output buffers, then the circuits given in FIGS. 3A and 4A are implemented. Except for the tri-state output buffer 50, 51, these circuits are basically the same as the output circuits of FIGS. 3 and 4. It should be noted, that because the original device circuit requires tri-state outputs on these pins, this tri-state buffer element is to be considered part of the original circuit and not part of the test support circuit. The only test support circuit element added over what was required for a standard output is the OR element 45, 46. This element ORs the ENABLE TEST (ENA TEST) signal with the driver control signal (DVR CNTL) from the original device circuitry to ensure the tri-state driver is turned on in the test mode.

EXAMPLE APPLICATION

Turning now to TABLE I below, an example of how the arrangement of the present invention is applied to a digital circuit device is shown. The sequence and types of I/O circuits shown in TABLE I are theoretical. They were not derived from any particular device but were selected to demonstrate the greatest number of application situations. This also shows how the test support circuitry described here is truly independent of the devices intended function.

TABLE I

THEORETICAL DEVICE APPLICATION

| | | | Single Sequential Group | | Multiple Sequential Group (FIG. 5) | |
|---|---|---|---|---|---|---|
| Device Pin (a) | Device I/O Type (b) | Function In Test Mode (c) | Group (d) | Select Rule (e) | Group (f) | Select Rule (g) |
| 1 | Input | Control | X | 6 | X | 6 |
| 2 | Output | Output | 1 End | 4 | 1 End | 4 |
| 3 | Input | Input | 1 Start | 1 | 2 Start | 1 |
| 4 | Bidirectional | Output | | 5 | 2 | 5 |
| 5 | Bidirectional | Output | | 5 | 2 | 5 |
| 6 | Tri-state | Output | | 4 | 2 | 4 |
| 7 | Tri-state | Output | | 4 | 2 End | 3 |
| 8 | Input | Input | | 2 | 3 Start | 1 |
| 9 | Ground | — | X | 6 | X | 6 |
| 10 | Input | Input | | 2 | 3 | 2 |
| 11 | Input | Input | | 2 | 3 | 2 |
| 12 | Bidirectional | Output | | 5 | 3 | 5 |
| 13 | Input | Input | | 2 | 3 | 2 |
| 14 | Output | Output | | 4 | 3 | 4 |
| 15 | Output | Output | | 4 | 3 | 4 |
| 16 | Output | Output | | 4 | 3 End | 3 |
| 17 | Input | Input | | 2 | 1 Start | 1 |
| 18 | Power | — | X | 6 | X | 6 |

Column a of Table I, lists each device pin of the theoretical 18 pin device. Column b, lists the usage of each pin. It indicates whether the pin is an input, output, or power connection. Also indicated is the type of output (tri-state or bidirectional) for each output pin. Column c indicates the function of the pin when the device is in the test mode. For a better understanding of the test circuits used in a tri-state and bidirectional outputs please refer to applicant's copending patent applications Ser. No. S. 7/633,861 and 7/633,853, filed on the same day as the instant application.

Two groups of two columns (d,e and f,g) follow column c. Each group defines a possible application of the test circuitry to the digital circuit device described in the first three columns. The first column in each group (columns d and f) show the result of the sequential pin group selection steps. A single sequential pin group selection is shown in column d, and a multiple sequential pin group selection is shown by column f.

Columns e and h show the selection rule that was used to determine the test circuit to be added to each pin. The multiple sequential group versions that results from the application process described in this table is shown in FIG. 5.

Figure 5:
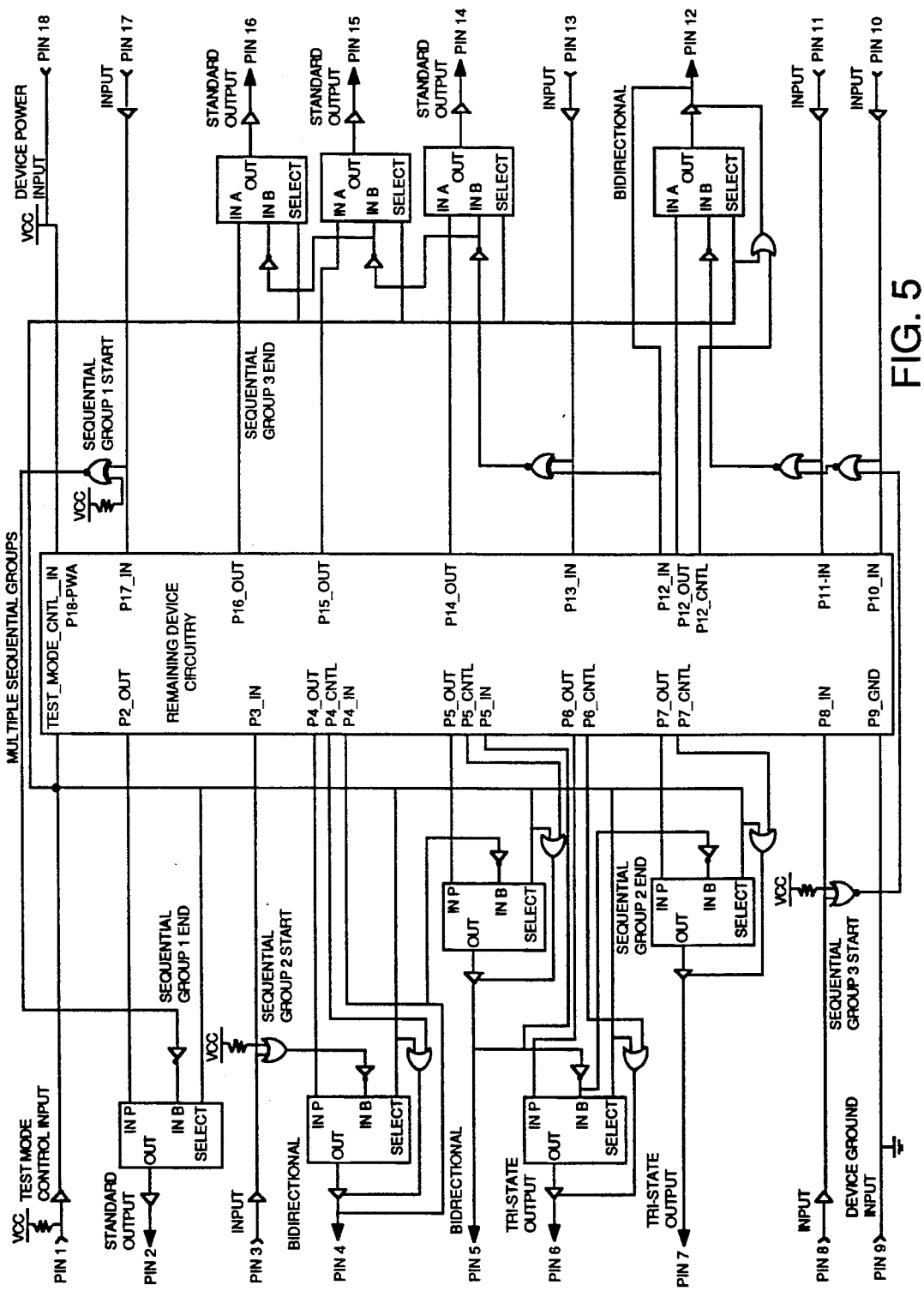
FIG. 5 is a circuit drawing showing the test circuitry added to the theoretical device detailed in Table I and having multiple sequential groups, in accordance with the present invention

Some points should be noted concerning the implementations shown in FIG. 5. Each group of the multiple sequential group starts at pins 3, 7, and 17. Additionally, FIG. 5 shows the maximum number of sequential groups that can be implemented on this device.

It should be noted, that the test circuitry shown in FIG. 5 is for an application which supports an integrated circuit. Many large logic IC devices use some type of buffer elements on their inputs. Therefore, buffer elements are being shown on all of the theoretical device's inputs. These input buffers are part of the device circuitry and not a part of the test circuitry. By placing the input test circuit elements behind the input buffers the buffer associated with input is also verified when the input is tested. The verification of the input buffer is important because most digital circuit device failures that may be induced by device handling during manufacturing will be to the buffer circuits and their connections the device packaging.

Another point to be highlighted is the implementation of rule 1 (FIG. 1 test circuit) on pin 3 of FIGS. 5. On this device, this pin test circuit was implemented with the same element shown on the FIG. 2 (Rule 2). However, the input usually connected to the Test In signal is pulled up instead. This would perform identically to the test circuit of FIG. 1.

In applying this arrangement of the present invention to an integrated circuit it would be more advantageous to use the same circuit for all input pins. The circuit could be made part of the standard input cell.

DESCRIPTION OF OPERATION

There are many ways in which the arrangement for testing digital circuit devices described above could be used to advantage. The following description depicts one possible usage for the device detailed in TABLE I and shown in FIG. 5. Since the test support circuit shown in FIG. 5 has three sequential pin groups, the test will be done in three parts and will be described in sequence of their group number. It should be noted however, that if the test set used for testing this device has sufficient capability the tests for the three groups could be done simultaneously.

When the digital circuit device has been finally assembled to a printed circuit board the completed circuit undergoes the verification test. At this point the entire PCBA to which the digital device is mounted is also assumed to be powered up. The first operation in the test will be to drive pin 1 of the device to a zero. This will enable the test mode of our example device. The test circuitry that was added will now be active.

The initial test places a logic signal which is continually changing state, at a known rate, on pin 17 of the device. Pin 2 of the device, is then observed for a signal which changes state at the same rate as the input signal. The presence of a such a signal will indicate that the device is properly powered-up and that pins 2 and 17 (the pins of the first sequential group) are connected and operating properly. The test signal is then removed from pin 17. This concludes the test of the first sequential group or group 1.

The test of the second sequential group or group 2, is begun by placing a logic "0" input signal on Pin 3. Output Pins 4 and 6 must then be observed. Pins 4 and 6 must be transmitting a logic "1" and output pins 5 and 7 a logic "0" in order for this group to test out successfully. The logic state of input Pin 3 is then changed to a logic "1". The four outputs of group 2 are then monitored to ascertain that they all changed into a logic state that is opposite to what they were previously. It should be noted that the logic level output of Pin 4 is the opposite of the logic level input to Pin 3. This insures that all of the adjacent pins in group 2 are not shorted together. Finally, the input is removed from Pin 3 to complete the group 2 test.

The test for the third and last group, group 3 is started by placing a logic "0" input signal on input Pins 8, 10, 11 and 13. Output pins 12, 14, 15 and 16 would then assume logic states 1,1,0,1, respectively. At this point several possible failures can be detected. One possible failure is if any one of the inputs are "stuck at 1". In this situation the output Pins 12, 14, 15 and 16 would assume the opposite of the normal logic state or 0,0,1,0, respectively. However, it would not be known which of one of the inputs was failing. The failing input would be determined by an additional test that will be explained in the next paragraph. Other failures, such as a single output that do not transmit the correct logic level would be detected during this test and would terminate the test of the device at this point.

If the circuit passes the group 3 test explained above then the group 3 test is continued by placing a logic "1" on each input of the group in sequence. All of the outputs in this group would have to change to the opposite logic state in order for the outputs to test normal. It should be noted, that when input 13 is changed to a logic state of "1", only output Pins 14, 15 and 16 will change state. A failing input pin would be discovered in this test when the output pins do not change state when the input pin is exercised. The testing of the digital circuit device is terminated at this point by removing the driving signals from the device input pins and returning Pin 1 to a logic state of "1", thereby, turning off the test mode.

It would be advantageous to review some of the salient benefits of the present invention.

First the circuits used in the arrangement of the present invention are simple and the digital circuit device requires very few additional logic elements to implement the hardware design of the arrangement. Further, no test mode control signals are required to be bused to the logic elements of the test arrangement and since the test signals involve adjacent pins only, many signal routing problems are avoided.

Second, since the test circuitry requires very few added logic elements, the required additional device area is kept to a minimum. The only operational parameter directly effected by the testing arrangement of the present invention is the output circuit propagation delay. This parameter is only increased by the delay of the single multiplexer logic element. Lastly, a minimum of device pins, typically one, is required by this test circuitry.

Third, only very simple set of sequences are necessary in order to exercise every pin of the digital circuit device. This greatly simplifies both the device parametric tests and the in-circuit tests run after the device has been assembled to its substrate.

Fourth, all the outputs of a sequential group of pins can be tested simultaneously. The test vectors required to be applied to the inputs are also very simple. This provides for very short tests that are in contrast to other methods, especially those utilizing shift registers, that require very long serial vectors in order to perform testing.

Fifth, the test circuitry described above is uniquely suitable to implementing on integrated circuit devices. This is due to the fact that the test circuitry involves only the input and output circuits of a device and that it utilizes very few logic elements. It is standard practice to place an integrated digital circuit devices I/O circuits next to each other around the periphery of the IC. Further, it would very effortless to design an integrated circuit input/output cells to incorporate the test circuits described in the present invention. As a result the arrangement of the present invention could be implemented with very little additional silicon area. Finally, making the circuitry part of a devices I/O cell could make implementation of the arrangement of the present invention completely automatic.

It will be obvious to those skilled in the art that numerous modifications to the present invention can be made without departing from the scope of the invention as defined by the appended claims. In this context, it should be recognized that the essence of the invention resides in novel arrangement for testing digital circuit devices having tri-state outputs.

What is claimed is:

1. An arrangement for testing the inputs and outputs of a digital circuit device, said digital circuit device including a plurality of inputs and outputs arranged in sequential groups, and a test mode control input for activating said arrangement, said arrangement comprising:

a first test signal input circuit connected to the first input of said sequential group, said first test signal input circuit arranged to receive a test signal applied to said first input and to pass said test signal to said first sequential group input, and to an included test out lead;

a second test signal input circuit including gate means having a first input lead connected to a test out lead, and a second input lead connected to the next input of said sequential group, said gate means arranged to exclusively combine the test signal received on said second input with the test signal received on said first input and to generate and output a test out signal from an included test out lead;

a first test signal output circuit including a first input connected to an output of said sequential group that is not the last output of said sequential group, a second input connected to a test out signal from an adjacent test out lead, said second input lead including means for inverting said test out signal, an enable test control lead for selecting between said first and second inputs, a standard output lead for passing the signal selected, and a test out lead connected to said second input inverted signal for passing said inverted test signal to the next test circuit;

a second test signal output circuit including a first input connected to an output of said sequential group that is the last output of said sequential group, a second input connected to a test out signal from an adjacent test out lead, said second input lead including means for inverting said input test out signal, an enable test control lead for selecting between said first and said second inputs, and a standard output lead for passing the signal selected for input;

a first test signal tri-state output circuit including a first input connected to an output of said sequential group that is not the last output of said sequential group, a second input connected to a test out signal from an adjacent test out lead, said second input lead including means for inverting said test out signal, an enable test control lead for selecting between said first and second inputs, gate means having an output and a first input connected to said enable test control lead and a second input connected to a driver control input from said digital circuit device, a tri-state gate having an output, an input connected to an output lead of said first test signal tri-state output circuit and an enabling input connected to said gate means output, said gate means enabling said tri-state gate to pass said input signal selected, and a test out lead connected to said second input inverted signal for passing said inverted test signal to the next test circuit; and a second test signal tri-state output circuit including a first input connected to an output of said sequential group that is the last output of said sequential group, a second input connected to a test out signal from an adjacent test out lead, said second input lead including means for inverting said input test out signal, an enable test control lead for selecting between said first and said second inputs, gate means having an output and a first input connected to said enable test control lead and a second input connected to a driver control input from said digital circuit device, a tri-state gate having an output, an input connected to an output lead of said first test signal tri-state output circuit, and an enabling input connected to said gate means output, said gate means enabling said tri-state gate to pass the input signal selected, whereby said test signal input into said first test signal input circuit is output at said second test signal tri-state gate output.

* * * * *